(12) United States Patent
Duerksen et al.

(10) Patent No.: US 7,183,183 B2
(45) Date of Patent: Feb. 27, 2007

(54) METHOD FOR USING ION IMPLANTATION TO TREAT THE SIDEWALLS OF A FEATURE IN A LOW-K DIELECTRIC FILM

(75) Inventors: Kenneth Duerksen, Austin, TX (US); David C. Wang, Austin, TX (US); Robert J. Soave, LaGrangeville, NY (US)

(73) Assignee: Tokyo Electron Limited, Tokyo (JP)

( * ) Notice: Subject to any disclaimer, the term of this patent is extended or adjusted under 35 U.S.C. 154(b) by 154 days.

(21) Appl. No.: 10/896,995

(22) Filed: Jul. 23, 2004

(65) Prior Publication Data
US 2005/0087516 A1    Apr. 28, 2005

Related U.S. Application Data

(60) Provisional application No. 60/489,100, filed on Jul. 23, 2003.

(51) Int. Cl.
*H01L 21/425* (2006.01)
(52) U.S. Cl. ........................ 438/524; 438/639; 438/783
(58) Field of Classification Search ................ 438/783
See application file for complete search history.

(56) References Cited

U.S. PATENT DOCUMENTS

| 5,906,911 A * | 5/1999 | Cote .......................... 430/316 |
| --- | --- | --- |
| 6,171,951 B1 * | 1/2001 | Lee et al. .................... 438/640 |
| 6,277,728 B1 * | 8/2001 | Ahn et al. ................... 438/619 |
| 6,423,652 B1 | 7/2002 | Chang et al. |
| 6,429,105 B1 * | 8/2002 | Kunikiyo ..................... 438/586 |
| 6,514,844 B1 | 2/2003 | Martin et al. |
| 6,664,182 B2 | 12/2003 | Jeng |
| 2003/0013296 A1 | 1/2003 | Apelgren et al. |
| 2004/0053498 A1 * | 3/2004 | Kaji et al. ................... 438/687 |

* cited by examiner

*Primary Examiner*—Stephen W. Smoot
(74) *Attorney, Agent, or Firm*—Oblon, Spivak, McClelland, Maier & Neustadt, P.C.

(57) ABSTRACT

A method for forming a mechanically strengthened feature in a low-k dielectric film on a substrate includes using either spin-on-dielectric (SOD) techniques, or chemical vapor deposition (CVD) techniques to form a low-k dielectric film on the substrate. A sidewall of the feature in the low-k dielectric film is then treated in order to increase the film's mechanical strength. Treatment of the sidewall of the feature in the low-k dielectric film comprises forming a hardened layer by subjecting the low-k dielectric film to low energy, high flux ion implantation. Process parameters of the ion implantation are selected such that the implantation process does not cause a substantial change in the dielectric constant of the low-k dielectric film.

28 Claims, 13 Drawing Sheets

METHOD FOR USING ION IMPLANTATION TO TREAT THE SIDEWALLS OF A FEATURE IN A LOW-K DIELECTRIC FILM

CROSS-REFERENCE TO RELATED APPLICATIONS

This application is related to and claims priority to U.S. provisional application Ser. No. 60/489,100 filed on Jul. 23, 2003; the entire contents of which are herein incorporated by reference.

BACKGROUND OF THE INVENTION

1. Field of the Invention

The present invention relates to a method for treating a low-k dielectric film, and, more particularly, to a method for using ion implantation to treat the sidewalls of a feature in a low-k dielectric film following an etch process.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Thus, in recent years, low-k materials have been developed to replace relatively high dielectric constant insulating materials, such as silicon dioxide, utilized for inter-level and intra-level dielectric layers between metal layers of semiconductor devices. Such low-k materials can be deposited by a spin-on dielectric (SOD) method similar to the application of photo-resist, or by chemical vapor deposition (CVD). Thus, the use of low-k materials is readily adaptable to existing semiconductor manufacturing processes.

However, one drawback to using low-k films in semiconductor manufacturing is that such films have demonstrated a low mechanical strength. This makes the films susceptible to damage in downstream process steps, such as during chemical-mechanical polishing (CMP), resulting in low product yields and/or decreased device reliability. This low mechanical strength of low-k films has prevented them from receiving widespread acceptance by device manufacturers. Thus, the performance advantages to using low-k films have been largely unrealized.

SUMMARY OF THE INVENTION

One aspect of the present invention is to reduce or eliminate any or all of the above-described problems.

Another object of the present invention is to treat the sidewalls of a feature in a low-k dielectric film using ion implantation.

These and other objects of the present invention are provided by a low-k dielectric film, as well as a method for forming the low-k dielectric film. The inventive method of producing a low-k dielectric film on a substrate comprises forming the low-k dielectric film on the substrate; forming a mask on the low-k dielectric film; forming a pattern in the mask; forming at least one feature in the low-k dielectric film by transferring the pattern in the mask to the low-k dielectric film; and treating a sidewall of the feature in the low-k dielectric film using an ion implantation process.

Additionally, the method can further comprise metallizing the at least one feature in the low-k dielectric film; and heating the substrate to a temperature less than 450 C.

Alternatively, the method can further comprise metallizing the at least one feature in the low-k dielectric film; and forming at least one of a metal boride, and a metal germanide, wherein the ion implantation process comprises at least one of a Boron ion, and a Germanium ion.

The inventive hardened low-k dielectric film includes a low-k dielectric film, a feature formed in the low-k dielectric film; and a hardened surface layer on a sidewall of the feature formed in the low-k dielectric film. The hardened surface layer is formed by subjecting the sidewall of the feature in the low-k dielectric film to an ion implantation process

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EXEMPLARY EMBODIMENTS

Figure 1A:
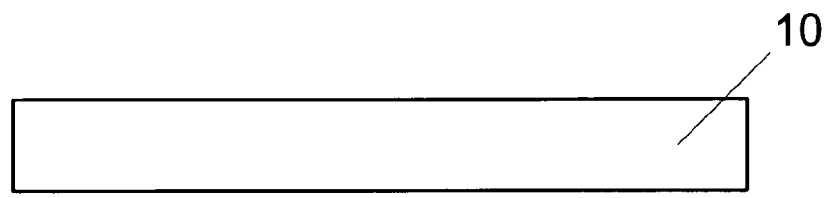
FIGS. 1A through 1D present a simplified schematic representation of a method of forming and treating a low-k dielectric film in accordance with an embodiment of the present invention.
Figure 1B:
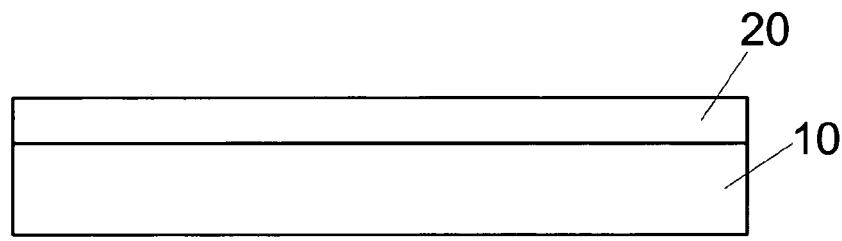

Referring now to the drawings, wherein like reference numerals designate identical or corresponding parts throughout the several views, FIGS. 1A through 1D present a schematic representation of a method of forming a low-k dielectric film and treating the film to improve the mechanical strength of the film, according to an embodiment of the present invention. As shown in FIGS. 1A and 1B, a low-k dielectric film 20 is formed on an upper surface of a substrate 10 that may or may not include additional layers. The substrate 10 may be a semiconductor, a metallic conductor, or any other substrate to which the low-k film is to be formed upon. The low-k dielectric film has a nominal dielectric constant value less than the dielectric constant of $SiO_2$, which is approximately 4 (e.g., the dielectric constant for thermal silicon dioxide can range from 3.8 to 3.9). More specifically, the low-k dielectric film 20 may have a dielectric constant of less than 3.0, or a dielectric constant ranging from 1.6 to 2.7.

The low-k dielectric film 20 may include at least one of an organic, inorganic, and inorganic-organic hybrid material. Additionally, the low-k dielectric film 20 may be porous or non-porous. For example, the low-k dielectric film may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Alternatively, the low-k dielectric film 20 may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the low-k dielectric film 20 can comprise an organic material deposited using SOD techniques. Examples of such films include SiLK-I, SiLK-J, SiLK-H, SiLK-D, and porous SiLK semiconductor dielectric resins commercially available from Dow Chemical, and FLARE™, and Nano-glass commercially available from Honeywell.

Figure 1C:
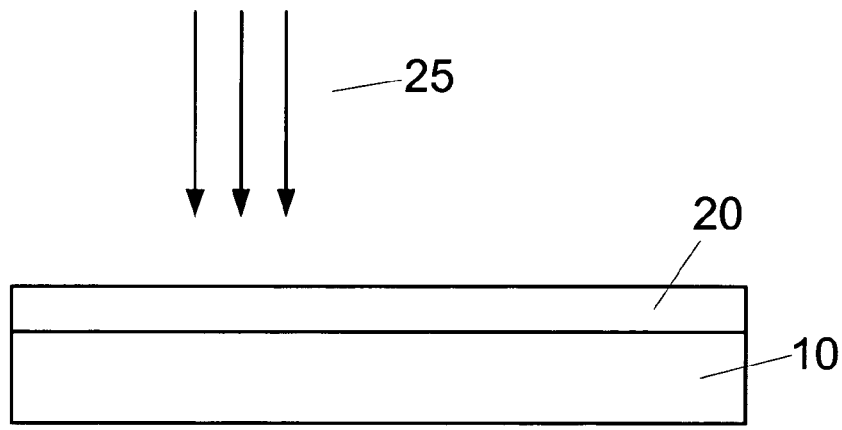
Figure 1D:
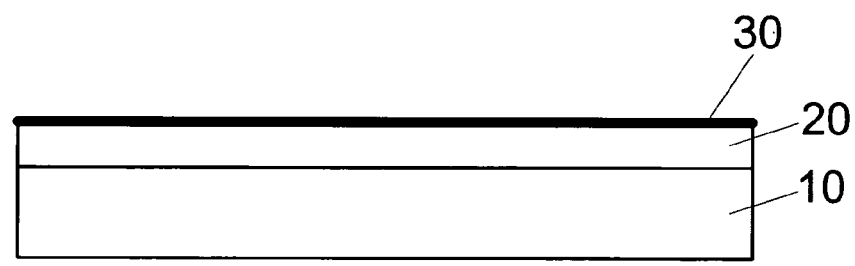

Once the low-k dielectric film 20 is prepared, the film 20 is treated by exposure to an ion implantation process 25, wherein the upper surface of the low-k dielectric film is subjected to ion bombardment as shown in FIG. 1C. Ions used for the implantation process are preferably selected such that the implantation process does not cause a substantial change in the nominal dielectric constant value of the low-k dielectric film 20. For example, inert ions, such as an ionized Noble gas (e.g. argon), may be used in the implantation process to minimize chemical bonding of the ion to the film 20. However, any ion that does not cause a substantial increase in the dielectric constant of the low-k dielectric film 20 may be used. As used herein, the term "substantial increase" means an increase that results in the dielectric constant of the film being permanently higher than the dielectric constant of $SiO_2$. As shown in FIG. 1D, subjecting the low-k dielectric film 20 to ion implantation forms a "crust", or hardened layer 30, on the upper surface of the film 20. The present inventors have discovered that forming this hardened surface 30 increases the overall mechanical strength of the low-k dielectric film 20. Thus, the hardened surface 30 reduces the likelihood that the low-k film 20 will be damaged during further processing of the substrate and film. Moreover, because the implantation process does not substantially change the dielectric constant of the low-k film 20, the mechanically strengthened film will still provide enhanced performance characteristics for ICs and other devices in which the film is used.

Figure 2:
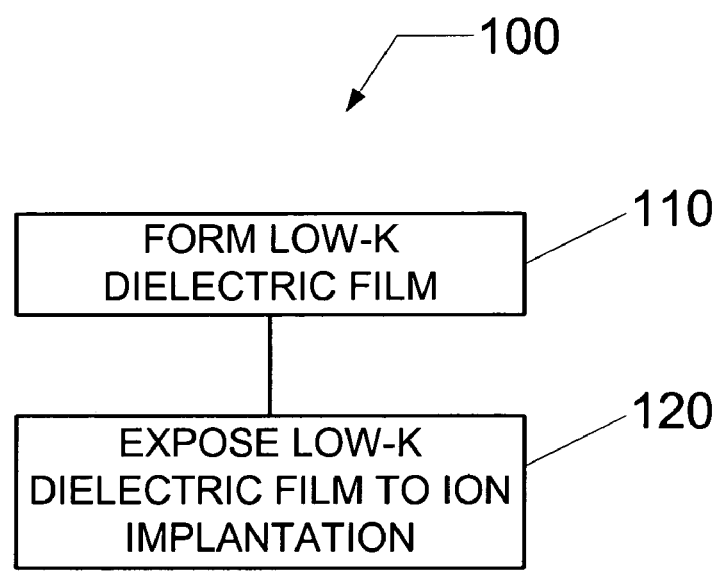
FIG. 2 presents a method of producing a low-k dielectric film according to an embodiment of the present invention.

FIG. 2 is a flow chart 100 illustrating a method of producing a low-k dielectric film in order to increase the mechanical strength of the film, in accordance with an embodiment of the present invention. As seen in FIG. 2, flow chart 100 begins with forming the low-k dielectric film on a substrate as shown by step 110. As noted above, the low-k dielectric film has a nominal dielectric constant, and may include organic, inorganic, and inorganic-organic hybrid materials. The low-k dielectric film can be formed using CVD techniques, or SOD techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. Other systems and methods for forming a low-k dielectric film on a substrate are well known to those skilled in the art of both spin-on dielectric technology and CVD dielectric technology.

After forming the low-k dielectric film 20 on substrate 10, the low-k dielectric film is subjected to ion implantation in order to form the hardened surface layer 30 as shown by step 120. For example, the ion implantation may be performed in a commercially available ion implant tool, such as an Axcelis GSD 200, GSD 200 HE, GSD 200 EE, HC3, GSD III/LED, MC3, and HE3, offered by Axcelis Technologies, Inc.; a Varian ES00, Varian VIISta 80, VIISta 810 HP, VIISta 3000, and a Varian VIISion, offered by Varian Semiconductor Equipment Associates; or an AMAT xR120, offered by Applied Materials, Inc. As noted above, the ion used in the implantation process is preferably an inert ion, which minimizes changes in the dielectric properties of the low-k dielectric film. Moreover, the ion implantation process is preferably performed at relatively low energy and high flux to minimize the change in dielectric constant of the film 20. The ion beam energy may, for example, range from 0.2 to 200 keV, and preferably ranges from 10 to 20 keV. Additionally, the ion beam dose may range from $5\times10^{15}$ to $1\times10^{16}$ atoms/cm$^2$, or $5\times10^{12}$ to $1\times10^{16}$ atoms/cm$^2$, and preferably ranges from $1\times10^{15}$ to $1\times10^{16}$ atoms/cm$^2$. However, any energy and dose that does not cause a permanent and substantial increase in the dielectric constant of the low-k dielectric film 20 may be used in accordance with the present invention. Implantation process parameters other than ion type, energy and dose may also vary as long as such variance does not cause a permanent and substantial increase in the dielectric constant of the low-k dielectric film 20.

Figure 3:
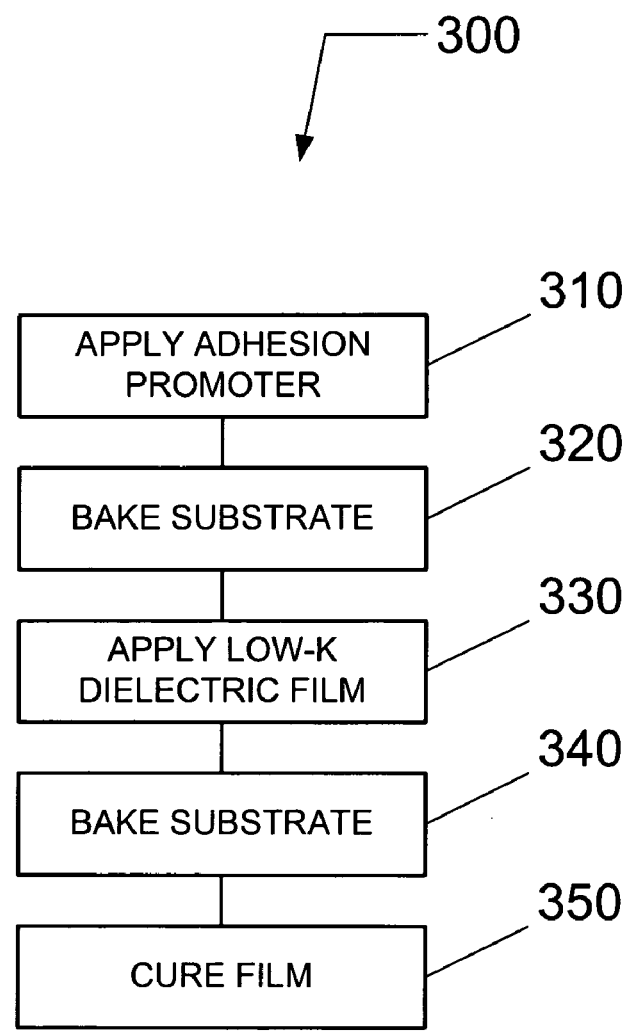
FIG. 3 presents an exemplary method of forming a low-k dielectric film on a substrate in accordance with an embodiment of the present invention.

FIG. 3 shows an example of an SOD process 300 that may be used to perform the forming step 110 of FIG. 2. As seen in FIG. 3, the process begins in step 310 with the application of an adhesion promoter to the substrate 10, if necessary. For instance, when forming a SiLK-based low-k dielectric film, an adhesion promoter is recommended. In step 320, the substrate is baked at 150 to 300 C, if an adhesion promoter is applied. As shown by step 330, once the adhesion promoter is applied and baked, the substrate 10 is spin coated with the low-k dielectric film 20. In step 340, the low-k dielectric film 20 is baked at a temperature of 150 to 300 C, and, in step 350, the low-k dielectric film is cured at 400 to 450 C in a furnace or a hot-plate bake tool. In one embodiment, the ion implantation process is performed following the cure step 350. In an alternate embodiment, the ion implantation process is performed prior to the cure step 350.

Figure 4:
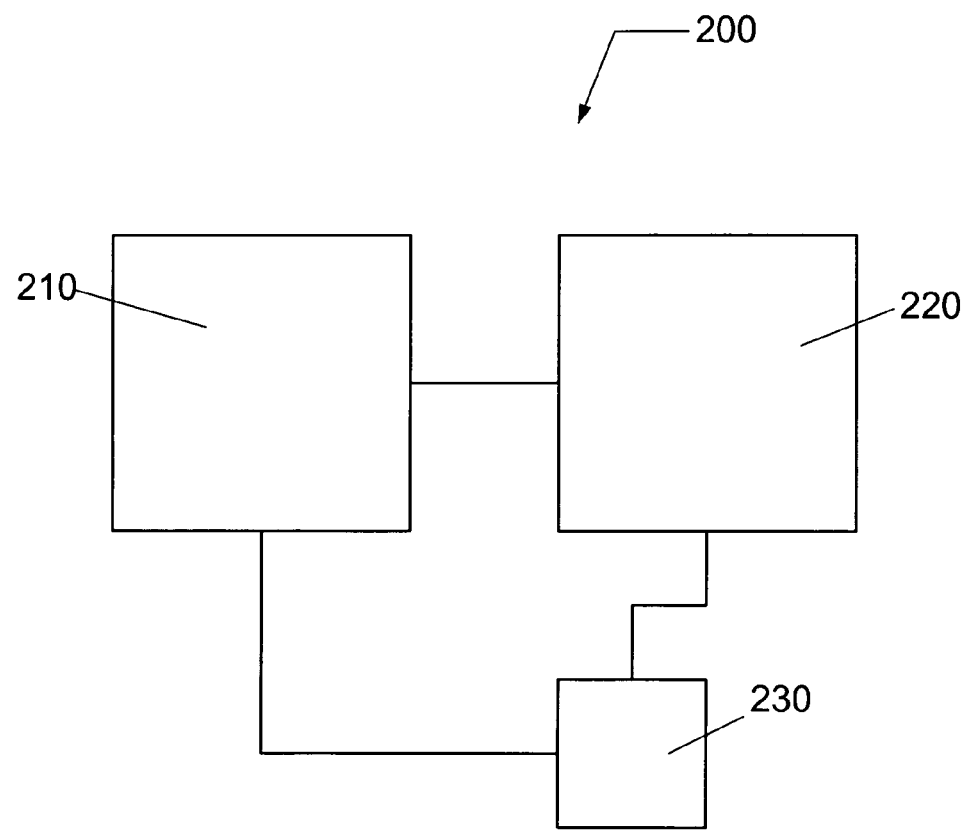
FIG. 4 presents a processing system for producing a low-k dielectric film according to another embodiment of the present invention.

FIG. 4 is a block diagram of a processing system for producing a low-k dielectric film in order to increase the mechanical strength of the film. As seen in this figure, the processing system 200 includes a film forming system 210 and an ion implant system 220 coupled to the film forming system 210. A controller 230 is coupled to the film forming system 210 and the ion implant system 220 to exchange data and information with these systems, as well as control the operation of each system according to a process recipe. The film forming system 210 and the ion implant system 220 may be directly coupled to one another, or each system can constitute a process module appended from a cluster tool substrate transfer configuration or a serial tool substrate transfer configuration.

As described above, the film forming system 210 may be a spin-on dielectric system, or a chemical vapor deposition system. The CVD system may or may not employ a plasma during processing. For example, the SOD system can comprise a Clean Track ACT 8 SOD, or an ACT 12 SOD coating system commercially available from Tokyo Electron Limited (TEL). Furthermore, the ion implantation system 220 may include conventional features, such as an ion source, a magnetic filter, an ion beam neutralizer, and a vacuum system, each of which is understood to those skilled in the art of ion implant system design. For example, the ion implant system 220 may be capable of an ion beam energy ranging from 5 to 50 keV, and an ion beam dose ranging from $0.5 \times 10^{15}$ to $1 \times 10^{16}$ atoms/cm$^2$.

Controller 230 includes a microprocessor, memory, and a digital I/O port (potentially including D/A and/or A/D converters) capable of generating control voltages sufficient to communicate and activate inputs to the film forming system 210 and the ion implant system 220 as well as monitor outputs from these systems. A program stored in the memory is utilized to interact with the systems 210 and 220 according to a stored process recipe. One example of controller 230 is a DELL PRECISION WORKSTATION 530™, available from Dell Corporation, Austin, Tex. The controller 230 may also be implemented as a general purpose computer such as the computer described with respect to FIG. 9.

Controller 230 may be locally located relative to the film forming system 210 and the ion implant system 220, or it may be remotely located relative to the film forming system 210 and the ion implant system 220 via an internet or intranet. Thus, controller 230 can exchange data with the film forming system 210 and the ion implant system 220 using at least one of a direct connection, an intranet, and the internet. Controller 230 may be coupled to an intranet at a customer site (i.e., a device maker, etc.), or coupled to an intranet at a vendor site (i.e., an equipment manufacturer). Furthermore, another computer (i.e., controller, server, etc.) can access controller 230 to exchange data via at least one of a direct connection, an intranet, and the internet.

Figure 5A:
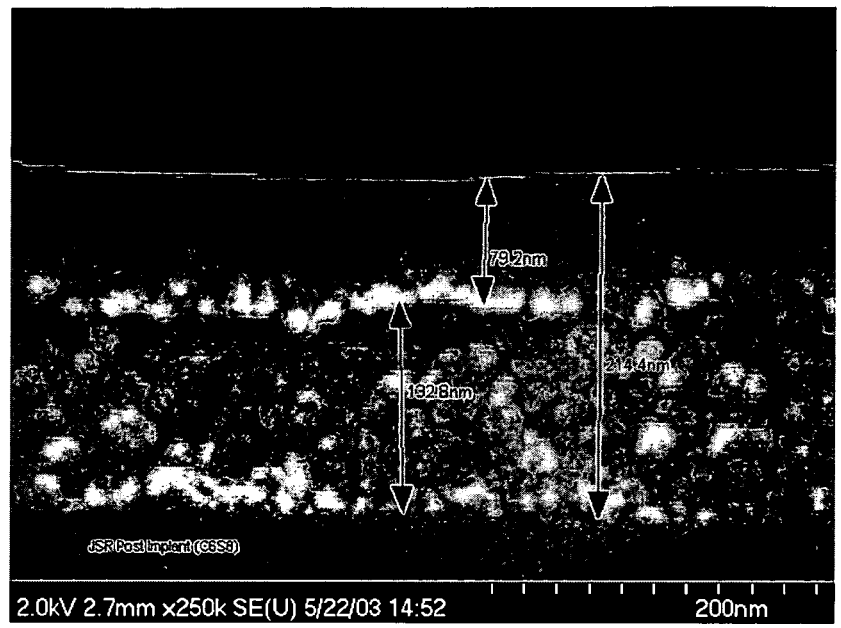
FIGS. 5A and 5B show scanning electron microscope (SEM) views of a JSR low-k dielectric film ion implanted with a dose of $5^{15}$ at 20 KEV Argon ions, according to an embodiment of the present invention.
Figure 5B:
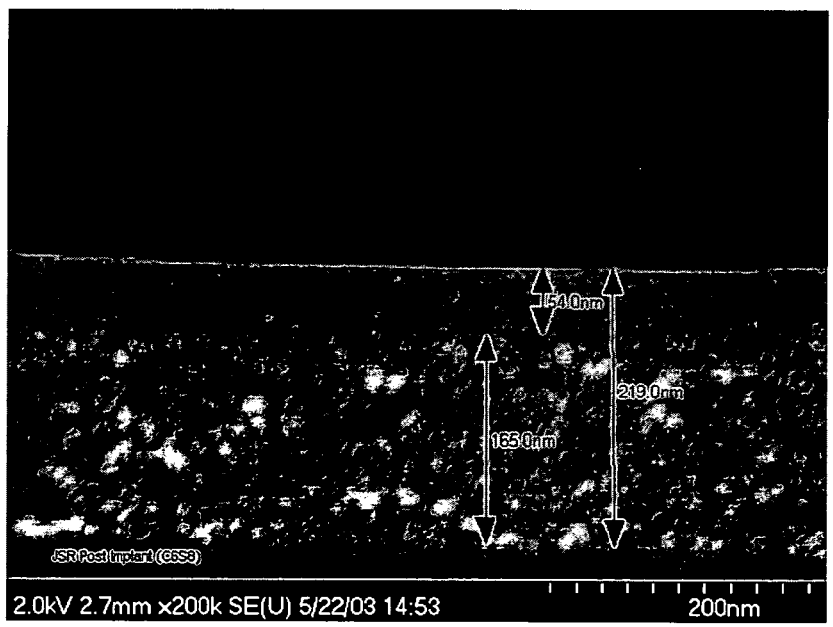
Figure 6:
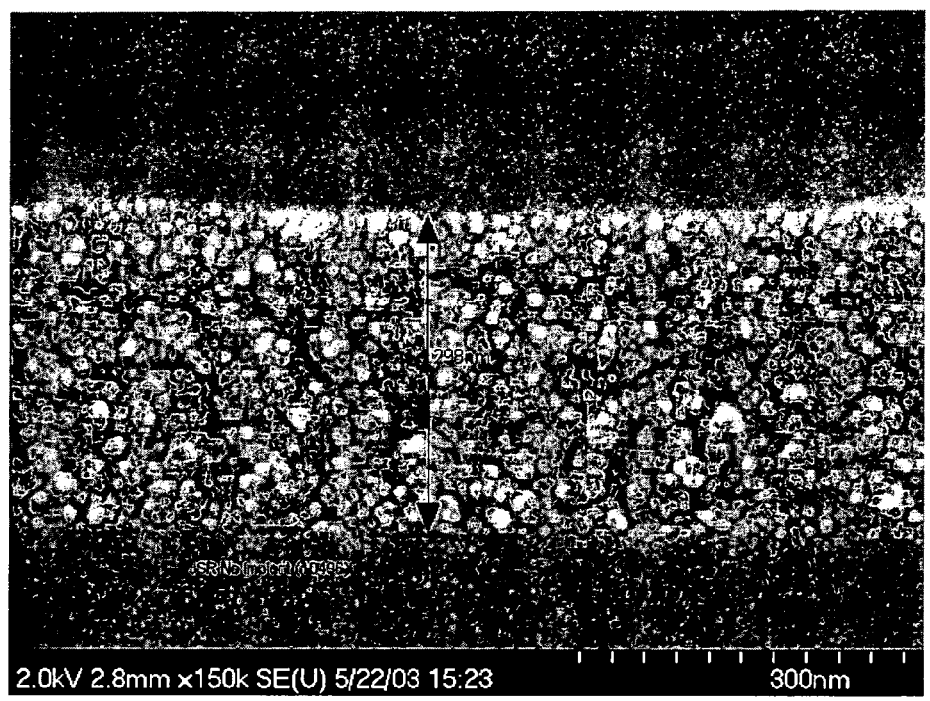
FIG. 6 shows an SEM view of a JSR low-k dielectric film without implantation, for comparison with FIGS. 5A and 5B.
Figure 7A:
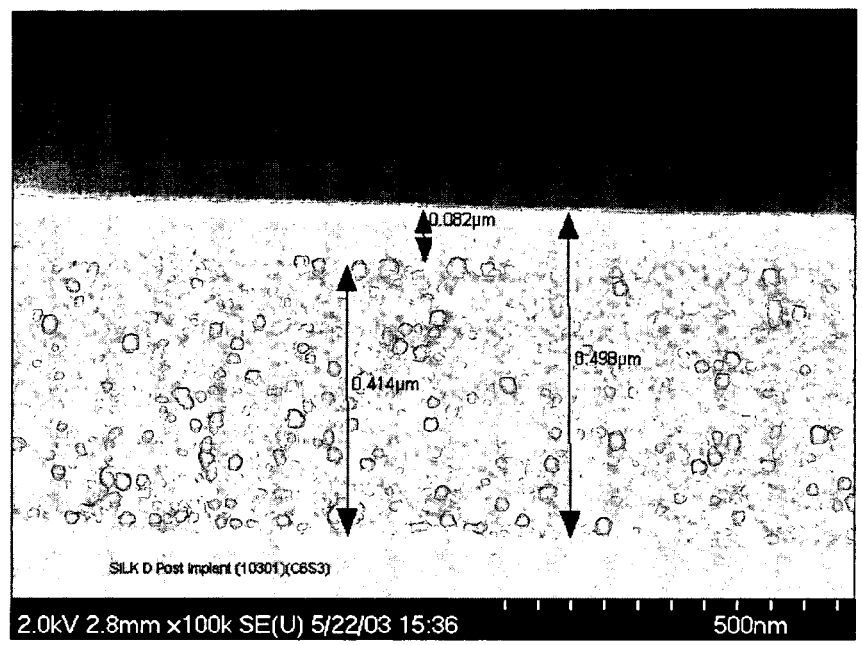
FIGS. 7A and 7B show SEM views of a Silk D low-k dielectric film ion implanted with a dose of $5^{15}$ at 20 KEV Argon ions, according to an embodiment of the present invention.
Figure 7B:
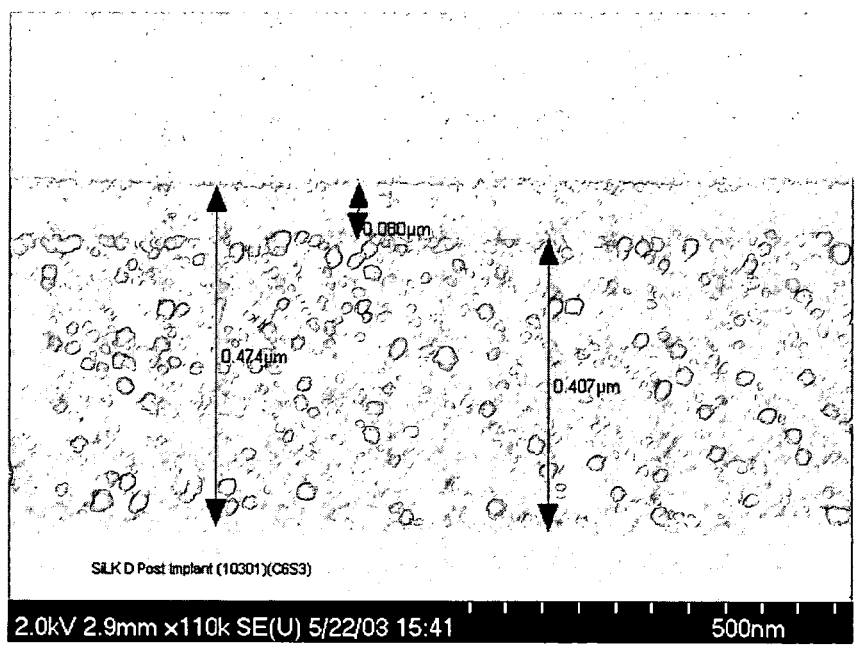
Figure 8A:
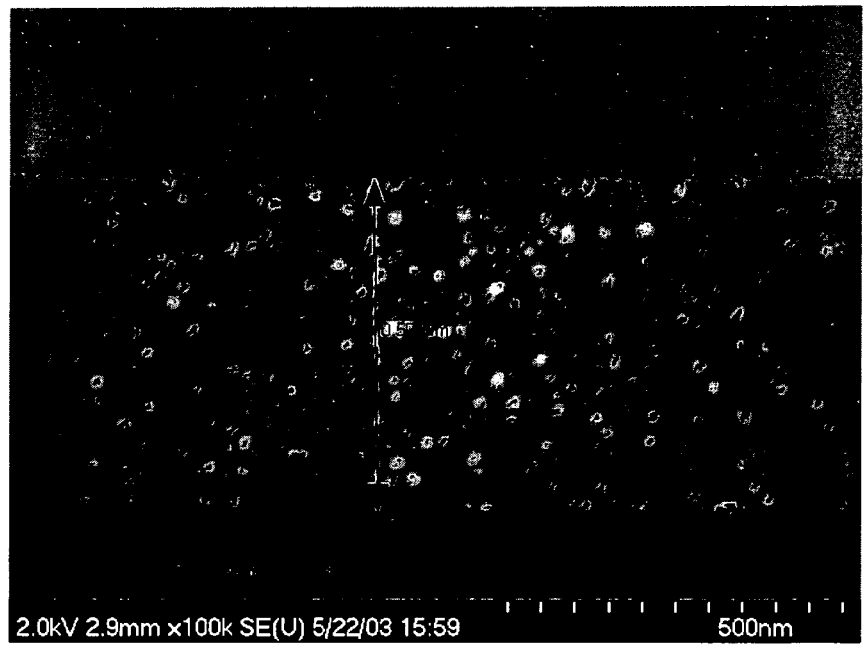
FIGS. 8A and 8B show an SEM view of a Silk D dielectric film without implantation, for comparison with FIGS. 7A and 7B.
Figure 8B:
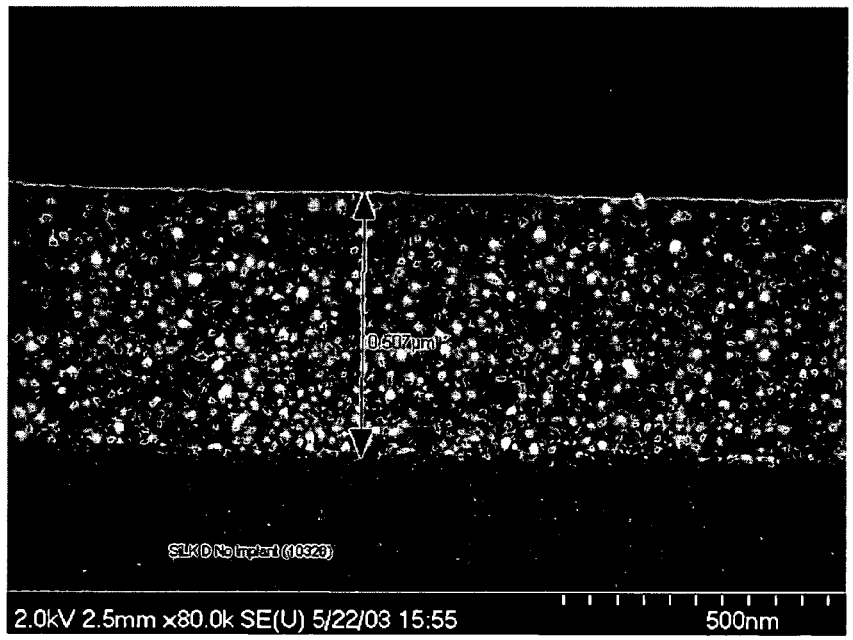

FIGS. 5A and 5B show scanning electron microscope (SEM) views of a JSR low-k dielectric film ion implanted with a dose of $5^{15}$ at 20 KEV Argon ions. As seen in these figures, a hardened layer of low-k dielectric film was obtained at a thickness of about 79 nm and 54 nm in FIGS. 5A and 5B, respectively. FIG. 6 shows an SEM view of a JSR low-k dielectric film without implantation, for comparison. Similarly FIGS. 7A and 7B show SEM views of a Silk D low-k dielectric film ion implanted with a dose of $5^{15}$ at 20 KEV Argon ions. As seen in these figures, a hardened layer of low-k dielectric film was obtained at a thickness of about 82 nm and 80 nm in FIGS. 7A and 7B, respectively. FIGS. 8A and 8B show a SEM view of a Silk D dielectric film without implantation, for comparison. Thus, the ion implantation process of the present invention is shown to provide a discrete hardened surface layer on commercially available low-k dielectric films.

Figure 9:
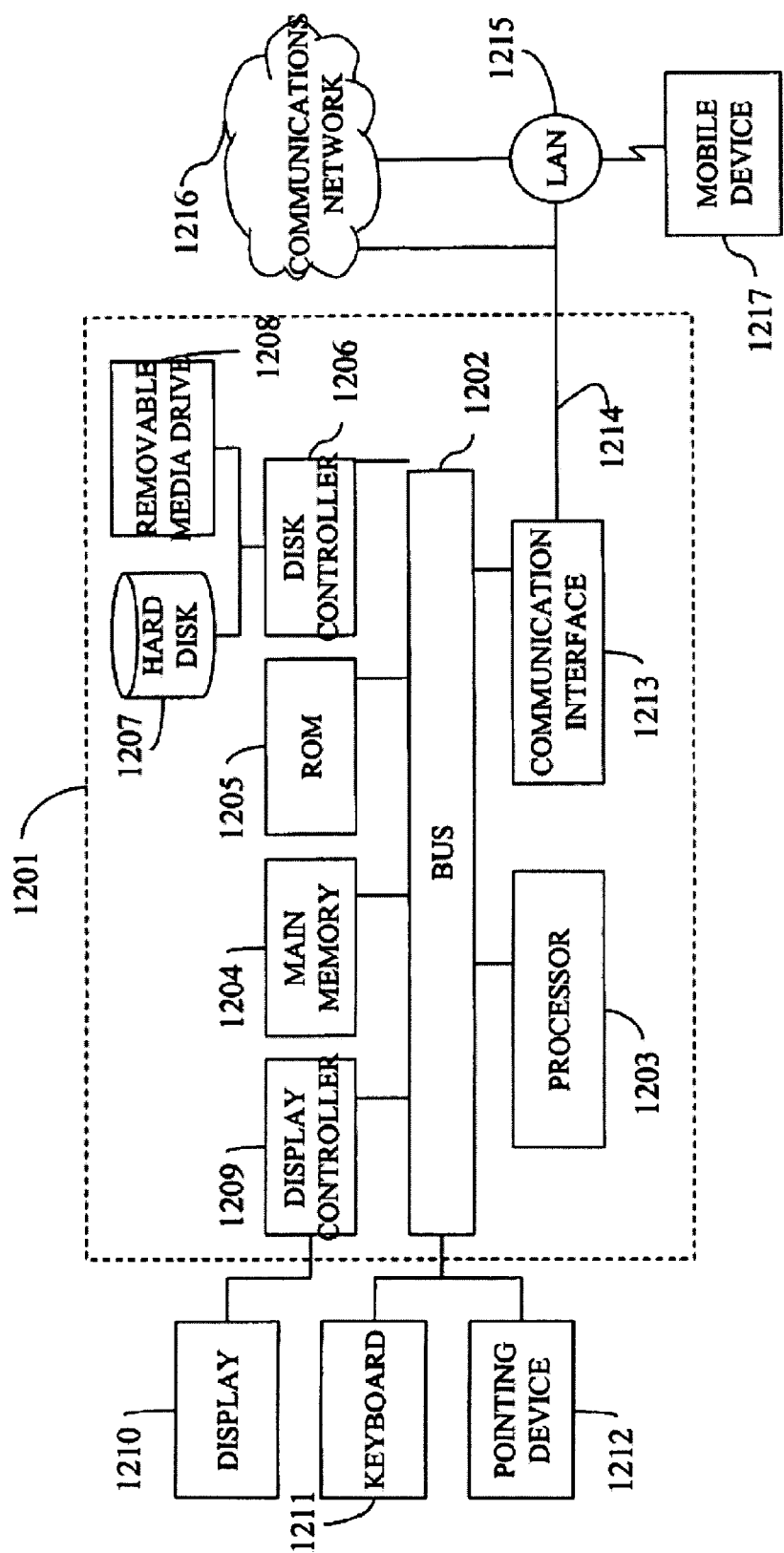
FIG. 9 presents a computer system upon which an embodiment of the present invention can be implemented.

FIG. 9 illustrates a computer system 1201 upon which an embodiment of the present invention may be implemented. The computer system 1201 may be used as the controller 230 to perform any or all of the functions of the controller described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

In another embodiment, ion implantation is utilized to treat the sidewalls of a feature formed in the low-k dielectric film. In order to construct intra- and inter-level connections within integrated circuits, the low-k dielectric film is patterned using, for example, a dry plasma etch process. Dry plasma etching can be used to transfer the pattern formed in a mask, using, for example, micro-lithography, to the underlying low-k dielectric film, whereby trenches, as well as vias and contacts, are formed within the low-k dielectric film in preparation of the metallization of these features. The etching of the low-k dielectric film, however, may cause a bumpy uneven surface on the sidewall, which may cause process problems when the metallization is integrated with the low-k film. This is particularly true where the low-k dielectric film is a porous film because exposing the pores by etching can result in a bumpy and uneven surface. For example, the resultant uneven surface can lead to problems during metallization, such as, but not limited to, mechanical strength issues, chemical absorption issues, adhesion issues, film conformality issues, and metal diffusion issues. Moreover, the integration of metallization, such as copper metallization, with low-k dielectric materials can allow migration of the metal into the low-k dielectric film thereby changing the dielectric constant of the film. The present inventors have discovered that these problems may be reduced and/or overcome by treating the sidewalls of the features formed within the low-k dielectric film following the etching process.

Additionally, for example, etch and ash processes can alter the film properties on the sidewalls when the features are created. Such examples include (but are not limited to) stripping carbon and leaving dangling bonds which become a hydrophilic surface (rather than the desired hydrophobic surface), and leaving various contaminants on the surface such as amines, which can cause resist poisoning depending on the integration scheme used. It is expected that the ion implantation process of the present invention can passivate these active sites. In addition, this modification of all of the walls after etch and ash processing can reduce or eliminate the need for adding chemical mechanical polishing (CMP) hardmask stops, or trench etch stops in dual damascene, or trench structures.

Figure 10:
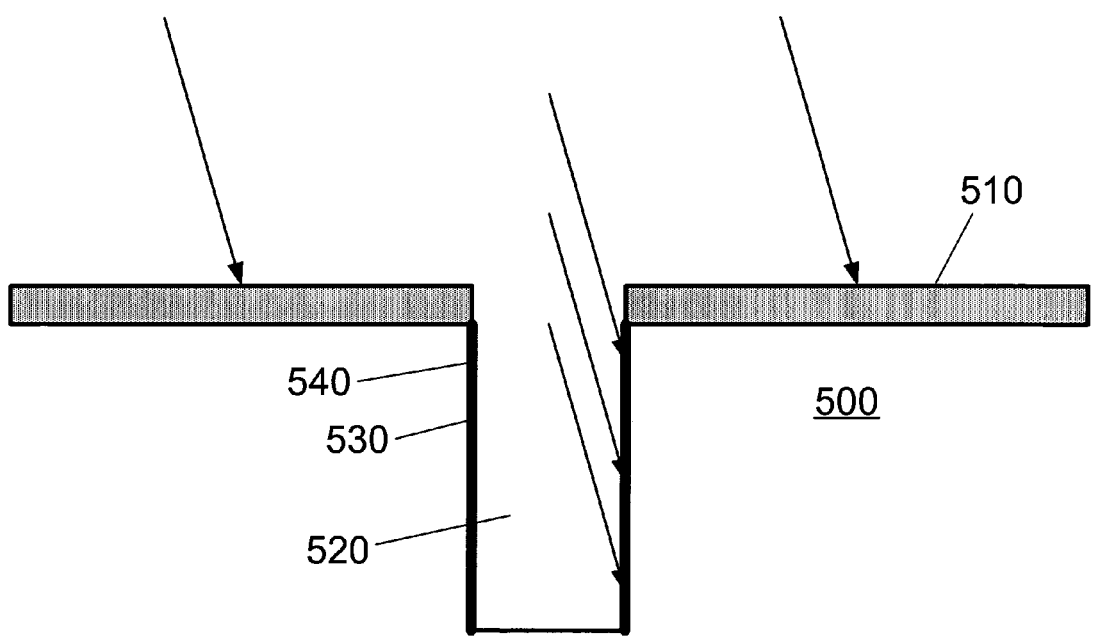
FIG. 10 illustrates a method of increasing the mechanical strength of a sidewall of a feature in a low-k dielectric film according to another embodiment of the present invention.

FIG. 10 illustrates a low-k dielectric film 500 and a mask 510 overlying the low-k dielectric film, wherein a feature 520 has been formed therethrough. The sidewalls 530 of feature 520 in low-k dielectric film 500 are treated using ion implantation (shown schematically as arrows in FIG. 10) such that a hardened film 540 is formed.

Figure 11:
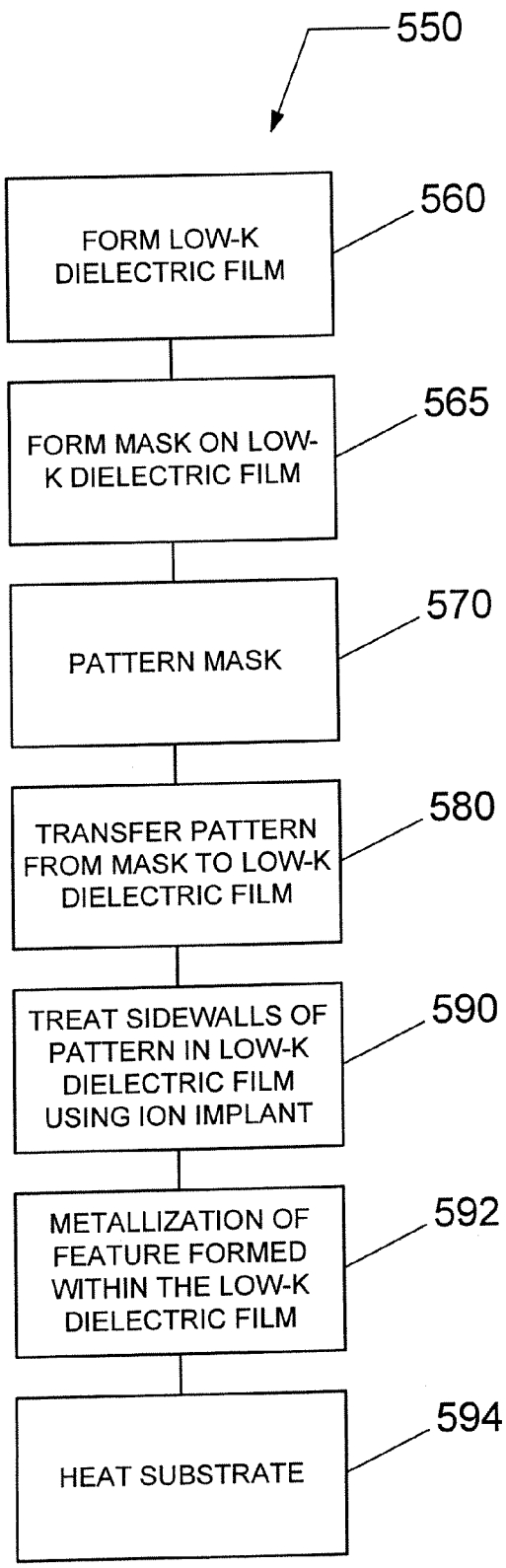
FIG. 11 presents an exemplary method of forming a low-k dielectric film on a substrate in accordance with another embodiment of the present invention.

FIG. 11 presents a method of treating a low-k dielectric film using ion implantation. The method comprises a flow chart 550 beginning in 560 with forming the low-k dielectric film on a substrate. As noted above, the low-k dielectric film has a nominal dielectric constant, and may include organic, inorganic, and inorganic-organic hybrid materials. The low-k dielectric film can be formed using CVD techniques, or SOD techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. Other systems and methods for forming a low-k dielectric film on a substrate are well known to those skilled in the art of both spin-on dielectric technology and CVD dielectric technology.

In 565, a mask is formed on the low-k dielectric film. The mask can, for example, comprise a light-sensitive material, such as photoresist. Moreover, the mask can be formed using spin coating techniques, such as a Clean Track ACT 8 or ACT 12 photoresist spin coating tool commercially available from Tokyo Electron Limited (TEL).

In 570, the mask is patterned using, for example, microlithography. The techniques utilized during formation and patterning of a mask are well known to those skilled in the art of mask preparation for dry plasma etching.

In 580, the pattern formed in the mask is transferred to the underlying low-k dielectric film. The mask transfer can be performed using, for example, dry plasma etching. The techniques for selectively etching a low-k dielectric film, such as those described earlier, are well known to those skilled in the art of low-k dielectric etch processes. For example, in order to etch inorganic low-k dielectric films, such as an oxidized organosilane film, a fluorocarbon-based dry plasma etch chemistry, such as $C_4F_8$, can be used with Argon, $O_2$, or $N_2$. Additionally, for example, in order to etch an organic low-k dielectric film, such as SiLK or FLARE, a nitrogen/hydrogen-based dry plasma etch chemistry can be employed.

Figure 12A:
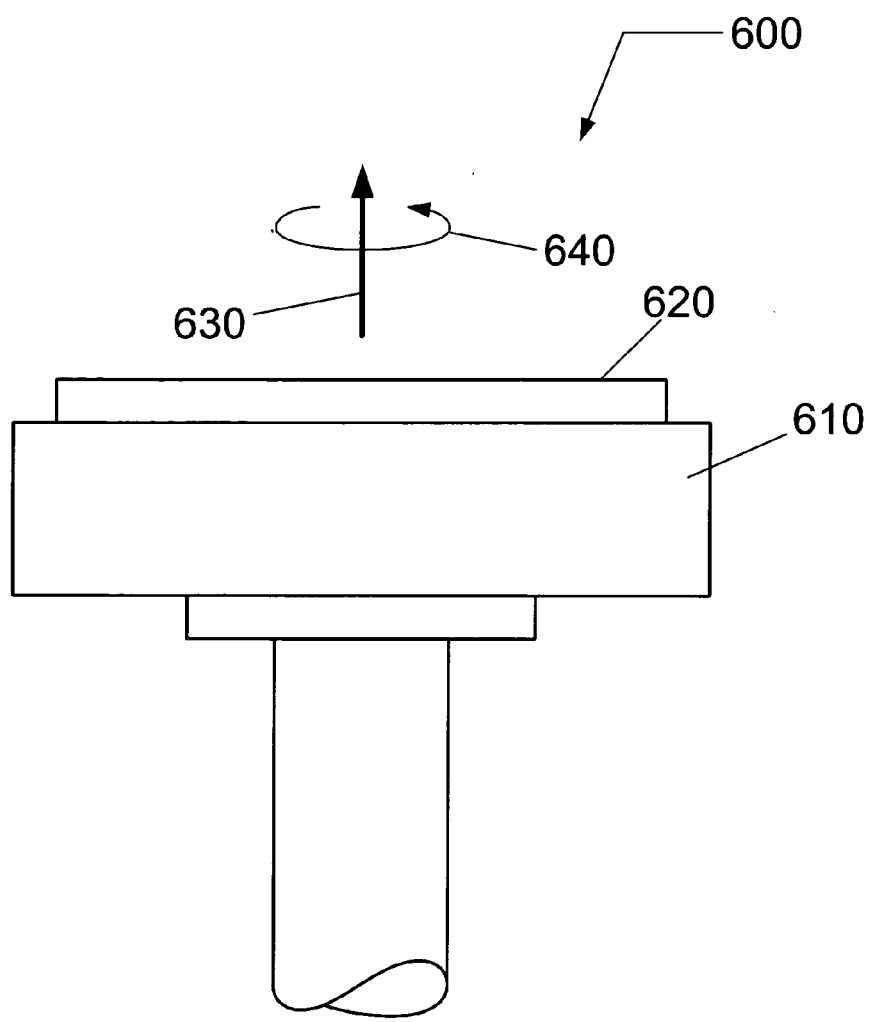
FIG. 12A shows an exemplary substrate holder for treating a low-k dielectric film on a substrate.
Figure 12B:
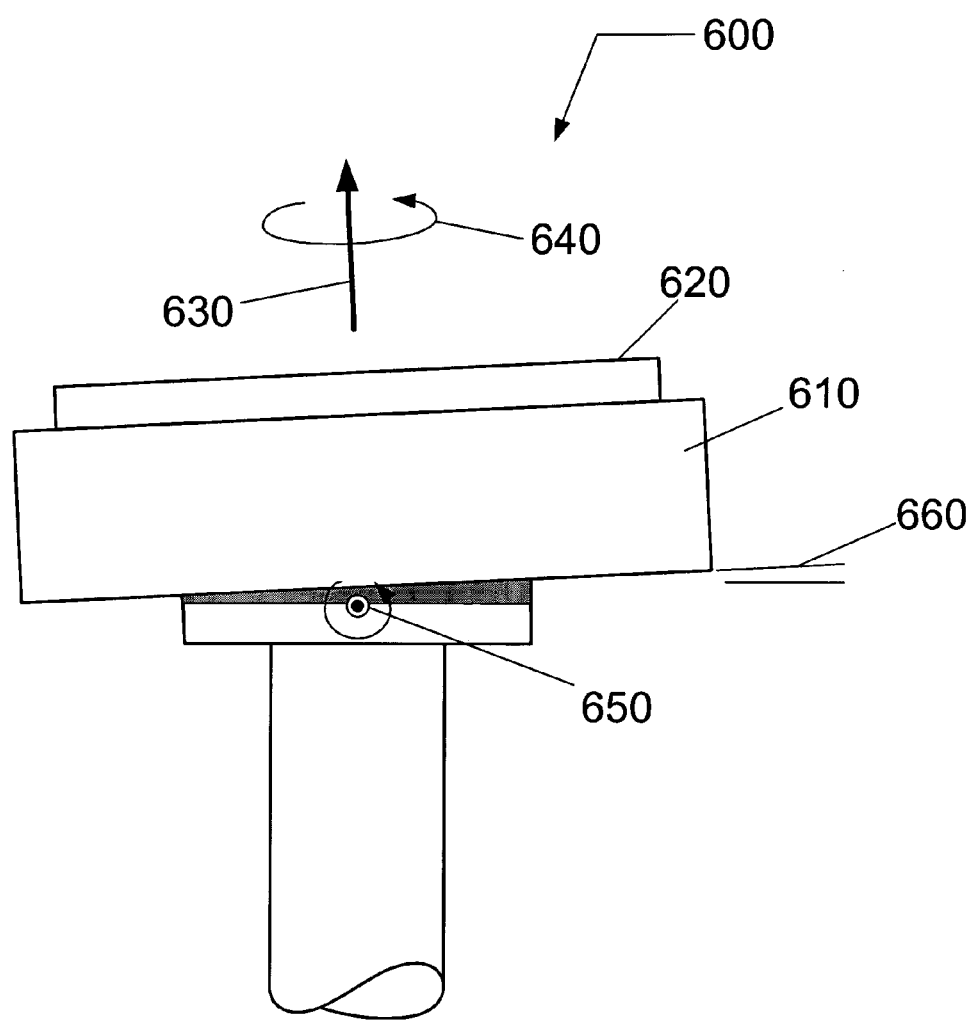
FIG. 12B shows the exemplary substrate holder of FIG. 12A wherein the substrate is tilted.

In 590, the sidewalls of the feature formed in the low-k dielectric film are treated using ion implantation in order to form a hardened surface layer. The ion implantation process is performed at an angle of incidence as illustrated in FIG. 10. In conventional ion implant systems, the substrate being treated is generally tilted in order to achieve an off normal incidence of the ion beam and, thereby, avoid ion channeling (that customarily occurs in crystalline structures when ion implant is performed normal to the substrate surface). In many conventional ion implant systems, a tilt angle of seven (7) degrees from normal to the substrate surface is employed. A tilt angle of seven degrees from normal to the substrate surface is sufficient to achieve treatment of features having an aspect ratio (feature depth-to-feature width) of 6-to-1 and less, even though this angle results in a very shallow angle of incidence relative to the sidewall surface. Aspect ratios greater than 6-to-1 require a more shallow tilt angle. Moreover, the substrate may be rotated in order to achieve irradiation of the entire substrate surface by the narrow ion beam. In one embodiment, the sidewall of the feature may be treated with an ion implantation process while treating the entire surface of the low-k dielectric film. In another embodiment, the sidewall of the feature may be treated without treating the entire surface of the low-k dielectric film. Ion implantation may be performed, for example, in a commercially available ion implant tool, such as an Axcelis GSD 200, GSD 200 HE, GSD 200 EE, HC3, GSD III/LED, MC3, and HE3 offered by Axcelis Technologies, Inc.; a Varian ES00, Varian VIISta 80, VIISta 810 HP, VIISta 3000, and a Varian VIISion, offered by Varian Semiconductor Equipment Associates; or an AMAT xR120, offered by Applied Materials, Inc. FIGS. 12A and 12B present simplified schematics of an ion implant substrate holder 600 comprising a pedestal 610 for supporting a substrate 620, and configured to rotate in a direction 640 about an axis 630 and configured to tilt in a direction 660 about an axis 650.

As noted above, the ion used in the implantation process can be an inert ion, such as a Noble gas, or it can be at least one of a a Boron ion, and a Germanium ion. In the former case, an inert ion can be utilized to physically alter the surface layer of the sidewall when forming the hardened surface layer. In the latter case, at least one of a Boron ion, and a Germanium ion can be utilized to physically alter and chemically alter the surface layer of the feature sidewall when forming the hardened surface layer. Moreover, the ion implantation process is preferably performed at relatively low energy and high flux to minimize the change in dielectric constant of the film. The ion beam energy may, for example, range from 0.2 to 200 keV, and preferably ranges from 10 to 20 keV. Additionally, the ion beam dose may range from $5\times10^{12}$ to $1\times10^{16}$ atoms/cm$^2$, and preferably ranges from $1\times10^{15}$ to $1\times10^{16}$ atoms/cm$^2$. However, any energy and dose that does not cause a permanent and substantial increase in the dielectric constant of the low-k dielectric film may be used in accordance with the present invention. Implantation process parameters other than ion type, energy and dose may also vary as long as such variance does not cause a permanent and substantial increase in the dielectric constant of the low-k dielectric film.

In 592, the method can further comprise metallizing the feature formed within the low-k dielectric film. The feature may be a trench, or it may be a contact or via. Moreover, the metallization process can comprise Aluminum metallization, Copper metallization, or any other metal known to be used for providing metallization in features formed in a low-k dielectric film. The present inventors recognized that during conventional Copper metallization, for example, a barrier layer is deposited upon the feature surfaces in order to prevent copper diffusion into the low-k dielectric film.

This is followed by the deposition of a copper seed layer, and a copper fill deposition. For example, the barrier layer can comprise Tantalum (Ta) and Tantalum Nitride (TaN), that can be deposited using physical vapor deposition (PVD), chemical vapor deposition (CVD), or atomic layer deposition (ALD), the copper seed layer can be deposited using PVD, and the bulk copper fill can be deposited using electroplating. Alternately, the barrier layer can comprise Tungsten (W) that can be deposited by CVD, or ALD. The seed layer may alternately comprise a metal other than copper such as, for example, Ruthenium, which can be deposited by CVD, ALD, or PVD.

When Boron, or Germanium ion implantation of the feature sidewalls occurs, as in one embodiment of the present invention, the barrier metal can react with the implanted layer to form a metal boride, or metal germanide. These materials can exhibit enhanced barrier properties compared to the as-deposited barrier metal. Furthermore, the implanted Boron or Germanium ions can allow the metallization process to comprise, for example, deposition of a metal seed layer followed by a metal fill deposition, without the need to deposit a barrier layer. In this embodiment of the invention, the seed layer can react with the implanted element to form an interfacial film of metal boride or metal germanide, which can serve as a copper barrier. Thus, in addition to providing increased mechanical strength and smoothing of the sidewall structure, the present invention can either enhance, or eliminates the need for the barrier layer required in conventional processes.

Thereafter, in 594, the method can further comprise heating the substrate in order to form at least one of a metal boride, metal phosphide, or a metal germanide, depending upon the type of ion implant utilized, wherein the metal boride, or the metal germanide serves as a (diffusion) barrier layer between the metal (e.g., copper) fill and the low-k dielectric film. The substrate temperature can be elevated to a temperature of 450C or less using at least one of a hot-plate bake, or thermal furnace.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of forming a feature in a low-k dielectric film formed on a substrate, the method comprising:
   forming said low-k dielectric film on said substrate, said low-k dielectric film having a nominal dielectric constant less than a dielectric constant of $SiO_2$;
   providing a mask on said low-k dielectric film;
   forming at least one feature in said low-k dielectric film by transferring a pattern in said mask to said low-k dielectric film;
   performing an ion implantation process, using at least one of a Boron ion and a Germanium ion, on a sidewall of said feature in said low-k dielectric film;
   metallizing said at least one feature in said low-k dielectric film, wherein said metallizing comprises at least one of depositing a metal seed layer within said feature, and performing a bulk metal fill deposition; and
   forming at least one of a metal boride. and a metal germanide.

2. The method of claim 1, wherein said forming said low-k dielectric film comprises performing at least one of a spin-on-dielectric technique and a chemical vapor deposition technique.

3. The method of claim 1, wherein said forming said low-k dielectric film comprises forming at least one of a porous film and a non-porous film.

4. The method of claim 1, wherein said forming said low-k dielectric film comprises forming a film having a dielectric constant less than a value of 3.0.

5. The method of claim 4, wherein said forming said low-k dielectric film comprises forming a film having a dielectric constant ranging from 1.6 to 2.7.

6. The method of claim 1, wherein said forming said low-k dielectric film comprises forming a film including an inorganic material.

7. The method of claim 6, wherein said forming a film including an inorganic material comprises forming a film including an inorganic-organic hybrid material.

8. The method of claim 6, wherein said forming a film including an inorganic material comprises forming a film including an oxidized organo silane.

9. The method of claim 6, wherein said forming a film including an inorganic material comprises forming a film including at least one of hydrogen silsesquioxane, and methyl silsesquioxane.

10. The method of claim 6, wherein said forming a film including an inorganic material comprises forming a film including a silicate-based material.

11. The method of claim 6, wherein said forming a film including an inorganic material comprises forming a collective film including silicon, carbon, and oxygen.

12. The method of claim 11, wherein said forming a collective film further comprises including hydrogen in said collective film.

13. The method of claim 1, wherein said performing comprises performing said ion implantation process at an ion energy ranging from 5 to 50 keV.

14. The method of claim 1, wherein said performing comprises performing said ion implantation process at an ion dose ranging from $5 \times 10^{12}$ to $1 \times 10^{16}$.

15. The method of claim 1, wherein said providing a mask on said low-k dielectric film comprises utilizing a photoresist spin coating system.

16. The method of claim 1, wherein said forming at least one feature in said low-k dielectric film comprises an etch process.

17. The method of claim 1, wherein said performing comprises irradiating the sidewall with an ion beam having an angle of trajectory less than 90 degrees relative to a main surface of said substrate.

18. The method of claim 1, further comprising performing an ion implant process on a surface of the substrate other than said sidewall.

19. The method of claim 1, wherein said performing comprises performing said ion implantation process at process parameters that will not cause a substantial increase in the nominal dielectric constant of the low-k dielectric film.

20. The method of claim 1, wherein said performing comprises performing said ion implantation process using an inert ion.

21. The method of claim 1, wherein said performing comprises performing said ion implantation using an ionized Noble gas.

22. The method of claim 1, wherein said performing comprises performing said ion implantation process at an ion energy ranging from 0.1 to 200 keV.

23. The method of claim 22, wherein said performing comprises performing said ion implantation process at an ion energy ranging from 10 to 20 keV.

24. The method of claim 23, wherein said performing comprises performing said ion implantation process at an ion dose ranging from $1\times10^{15}$ to $1\times10^{16}$.

25. The method of claim 1, further comprising heating said substrate to a temperature less than 450 C.

26. The method of claim 1, wherein said performing comprises irradiating the sidewall with an ion beam having an angle of trajectory approximately 7 degrees from normal to the substrate.

27. The method of claim 1, wherein said forming at least one feature comprises forming a feature having an aspect ratio greater than 6- to -1, and
  wherein said performing comprises irradiating the sidewall with an ion beam having an angle of trajectory less than 7 degrees from normal to the substrate.

28. A method of forming a feature in a low-k dielectric film formed on a substrate, the method comprising:
  forming said low-k dielectric film on said substrate, said low-k dielectric film having a nominal dielectric constant less than a dielectric constant of $SiO_2$;
  providing a mask on said low-k dielectric film;
  forming at least one feature in said low-k dielectric film by transferring a pattern in said mask to said low-k dielectric film; and
  performing an ion implantation process on a sidewall of said feature in said low-k dielectric film;
  forming a barrier layer on said sidewall; and
  performing said ion implantation process on said barrier layer using at least one of a Boron ion, and a Germanium ion, in order to enhance the barrier properties of said bamer layer.

* * * * *

UNITED STATES PATENT AND TRADEMARK OFFICE
CERTIFICATE OF CORRECTION

PATENT NO. : 7,183,183 B2 Page 1 of 1
APPLICATION NO. : 10/896995
DATED : February 27, 2007
INVENTOR(S) : Kenneth Duerksen et al.

It is certified that error appears in the above-identified patent and that said Letters Patent is hereby corrected as shown below:

Col. 12, line 67 (Claim 22), replace "ion energy ranging from 0.1 to 200 keV" with -- ion energy ranging from 0.2 to 200 keV --

Signed and Sealed this

Eighteenth Day of September, 2007

JON W. DUDAS
*Director of the United States Patent and Trademark Office*